(12) United States Patent
Ahr et al.

(10) Patent No.: US 12,239,991 B2
(45) Date of Patent: Mar. 4, 2025

(54) THERMAL UNIT AND DEVICE FOR THERMAL CYCLING BIOLOGICAL SAMPLES, AND METHOD FOR THERMAL CYCLING BIOLOGICAL SAMPLES USING SUCH DEVICE

(71) Applicant: Roche Molecular Systems, Inc., Pleasanton, CA (US)

(72) Inventors: Daniel Ahr, Neuenbuerg (DE); Sara Zimmermann, Schoemberg (DE); Andreas Klittich, Pforzheim (DE); Andre Wurster, Hoefen (DE); Michael Fautz, Stutensee (DE)

(73) Assignee: Roche Molecular Systems, Inc., Pleasanton, CA (US)

( * ) Notice: Subject to any disclaimer, the term of this patent is extended or adjusted under 35 U.S.C. 154(b) by 519 days.

(21) Appl. No.: 17/161,945

(22) Filed: Jan. 29, 2021

(65) Prior Publication Data

US 2021/0237087 A1 Aug. 5, 2021

(30) Foreign Application Priority Data

Jan. 30, 2020 (EP) .................................... 20154489

(51) Int. Cl.
*B01L 7/00* (2006.01)

(52) U.S. Cl.
CPC .......... *B01L 7/52* (2013.01); *B01L 2200/147* (2013.01); *B01L 2300/0829* (2013.01); *B01L 2300/1822* (2013.01)

(58) Field of Classification Search
CPC ..................... B01L 2300/1822; B01L 3/50851
See application file for complete search history.

(56) References Cited

U.S. PATENT DOCUMENTS

| 6,308,771 | B1 * | 10/2001 | Tavassoli | ................. F28F 3/02 257/722 |
|---|---|---|---|---|
| 8,962,306 | B2 | 2/2015 | Cohen | |
| 2003/0079859 | A1 | 5/2003 | Hegde | |
| 2004/0149725 | A1 | 8/2004 | Brown | |
| 2010/0122807 | A1 * | 5/2010 | Harttig | ..................... B01L 7/52 165/185 |
| 2021/0237087 | A1 | 8/2021 | Ahr | |

FOREIGN PATENT DOCUMENTS

| EP | 1366327 B1 | 11/2005 |
|---|---|---|
| WO | 198912502 A1 | 12/1989 |

* cited by examiner

Primary Examiner — Natalia Levkovich
(74) Attorney, Agent, or Firm — Maneesh Gupta

(57) ABSTRACT

The present disclosure is directed to a thermal unit for a device for thermal cycling, also referred to as thermocycling, of a plurality of biological samples simultaneously, to such device itself, and also to a method for thermal cycling a plurality of biological samples simultaneously using such device and thermal unit.

17 Claims, 4 Drawing Sheets

THERMAL UNIT AND DEVICE FOR THERMAL CYCLING BIOLOGICAL SAMPLES, AND METHOD FOR THERMAL CYCLING BIOLOGICAL SAMPLES USING SUCH DEVICE

CROSS-REFERENCE TO RELATED APPLICATION

This application claims the benefit and priority of European Application Serial No. 20154489.7, filed Jan. 30, 2020, which is incorporated herein by reference.

TECHNICAL FIELD

Generally, the present disclosure relates to the technical field of sample analysis, such as the analysis of biological samples, and further to the technical field of high throughput analysis of biological samples.

In particular, the present disclosure is directed to a thermal unit for a device for thermal cycling, also referred to as thermocycling, of a plurality of biological samples simultaneously, to such device itself, and also to a method for thermal cycling a plurality of biological samples simultaneously using such device and thermal unit.

In other words, the present disclosure relates in general to a thermal cycling structure for performing chemical and/or biological reactions, such as, for example, Polymerase Chain Reactions (PCR), wherein such thermal cycling structure can be provided as internal part of a laboratory instrument, such as a thermocycler or thermal cycler, and wherein such thermal cycling structure usually includes at least a sample mount, a heat pump with a heat sink, as well as a control unit for controlling the heating and cooling of the heat pump during thermal cycling. The present disclosure is particularly directed to a thermal unit of such thermal cycling structure for simultaneously generating multiple nucleic acid amplification reactions during thermal cycling biological samples by means of such thermal cycling device, wherein the thermal cycling structure can comprise more than one of such thermal units. Additionally, the present disclosure relates to a method for thermal cycling a plurality of biological samples simultaneously using such device and thermal unit, wherein a thermocycling protocol is performed under feedback-control by a computer or the like.

BACKGROUND

Biological samples are usually taken from patients by medical personnel in hospitals or in private practice, for laboratory analysis, e.g. for determining concentration levels of different components within the taken samples. Accordingly, the terms "sample" and "biological sample" refer to material(s) that may potentially contain an analyte of interest, wherein the biological sample can be derived from any biological source, such as a physiological fluid, including blood, saliva, ocular lens fluid, cerebrospinal fluid, sweat, urine, stool, semen, milk, ascites fluid, mucous, synovial fluid, peritoneal fluid, amniotic fluid, tissue, cultured cells, or the like, and wherein the sample can be suspected to contain a certain antigen or nucleic acid.

For many biological, biochemical, diagnostic or therapeutic applications, it is essential to be able to accurately determine the amount or concentration of a certain substance or compound in a biological sample contained in a reaction mixture, such as a certain antigen or nucleic acid as mentioned above. In order to be able to achieve this goal accurately, methods have been developed over the years, such as the widely known Polymerase Chain Reaction (PCR), for example in the form of digital PCR (dPCR), real-time PCR (qPCR), or reverse transcription polymerase chain reaction (RT-PCR), which enable the in vitro synthesis of nucleic acids in a biological sample, through which a DNA segment can be specifically replicated, i.e. a cost-effective way to copy or amplify small segments of DNA or RNA in the sample. In clinical diagnostics, PCR is particularly used to quantify nucleic acids strands in the form of sections of DNA or RNA by amplification in order to be able to detect a disease or mutation. In order to run such a PCR, a so called thermocycler is usually needed to heat up and cool down the sample and reaction mix within a reaction vessel over many cycles. Here, dPCR is a rather new variant of PCR methods to achieve higher precision and higher sensitivity, wherein the PCR method is applied to single DNA molecules separated into independent microfluidic reaction vessels, which allows to count the actual number of target DNA molecules after PCR, resulting in a "digital" result for each reaction vessel. This constitutes the main difference compared to other more conventional PCR methods. However, a large amount of reaction vessels, usually 20,000 or even more, are required, which can be arranged within one single microfluidic consumable.

As mentioned above, the development of dPCR for amplifying DNA or RNA segments has generated enormous benefits in gene analysis as well as the diagnosis of many genetic diseases, or also in the detection of viral load. In the course of a typical PCR conduct, a specific target nucleic acid is amplified by a series of reiterations of a cycle of steps in which nucleic acids present in the reaction mixture are (a) denatured at relatively high temperatures, for example at a denaturation temperature of more than 90° C., usually about 94-95° C., for separation of the double-stranded DNA, then (b) the reaction mixture is cooled down to a temperature at which short oligonucleotide primers bind to the single stranded target nucleic acid, for example at an annealing temperature of about 52-56° C. for primer binding at the separated DNA strands in order to provide templates (annealing), and, thereafter, (c) the primers are extended/elongated using a polymerase enzyme, for example at an extension temperature at about 72° C. for creation of new DNA strands, so that the original nucleic acid sequence has been replicated. Repeated cycles of denaturation, annealing and extension, usually about 25 to 30 repeated cycles, result in the exponential increase in the amount of target nucleic acid present in the sample, wherein the time for heating and cooling the samples has a significant influence on the overall process time. Accordingly, less time spent at non-optimum temperatures results in better or more precise chemical outcomes. In particular, a specific minimum time for holding any reaction mixture at each of the temperature plateaus is required after reaching the same, wherein such minimum holding times the minimum time it takes to complete one thermal cycle. Any time in transition between PCR temperature plateaus is time added to this minimum cycle time. Therefore, since the number of thermal cycles can be large, such additional time unnecessarily heightens the total time needed to complete PCR conduct. Thus, a decrease in heating and cooling time is essential for an efficient and cost effective process and an increase in throughput of a thermal cycling device for PCR. Accordingly, there is a need to make diagnostic assays faster, cheaper and simpler to perform while achieving precision as well as efficiency.

Commonly known thermal cycling devices for amplifying DNA segments by means of PCR, as disclosed e.g. in WO 2007/146443 A2, basically consist of a mount for receiving the samples and a heat pump attached to the mount, wherein the combination of mount and heat pump can also be referred to as heat block or thermal block. The heat pump, often provided in the form of a thermoelectric device or thermoelectric cooler (TEC), for example in the form of a Peltier element, is usually used for active heating and cooling of the mount and, thus, for actively controlling the temperature provided to the samples. TECs are solid-state heat pumps usually made from semiconductor materials sandwiched between ceramic plates, wherein an amount of heat pumped is proportional to the amount of current flowing through the TEC, resulting in increased temperature control, wherein, by reversing the current, TECs can function as heaters or coolers, which is highly useful for thermal cycling at different temperatures. In other words, TECs transform electrical energy into heat or cold. Here, in addition to the mount for receiving the samples by the heat block, TECs can be further combined with a heat sink or cooling block attached to one side, wherein the sample mount is arranged on the other side of the Peltier element.

The combination of one or several TECs with a cooling block can also be called a "Peltier sandwich" or "thermal unit." To ensure correct and reliable thermal performance of such a thermal unit, the heat transfer between its components is critical and must be as high as possible and within tight tolerances. Therefore, conductive foils or phase change material can be provided between TEC, cooling block and sample mount. Such foils are thin and fragile and therefore hard to apply, and—after assembly—some types of foils need to be heated-up in order to melt and, thus, close any micro-gaps and unevenness between the components of the thermal unit, in order to ensure sufficient heat transfer. However, due to the complexity of such a thermal unit assembly and in view of the thermal performance that needs to be ensured, a replacement of just the Peltier element within the thermal unit in case of a failure or defect can only be performed with high workload and, thus, high costs and is therefore not common practice.

Further, commonly known thermal cycling devices are often designed for standard qPCR or RT-PCR applications, i.e. they can only accommodate microtiter plates or single cuvettes. Thus, the amount of reaction cavities of one single PCR microtiter plate goes up to only at most 384 wells. This number of wells, however, is not sufficient compared to the 20,000 cavities or more cavities at least required for dPCR. Also, the geometry of the cavities in 384-well plates or single cuvettes is usually shaped like a cylinder or cone. Therefore, in order to ensure that the temperature generated in the thermocycler is correctly transferred into each part of the sample/reaction mix inside the wells or cuvettes, the design of the thermocycler's operational surface receiving the wells or cuvettes must be adapted to their respective cylinder or cone shape. Accordingly, an adapted thermocycler can only accommodate one type of plate or cuvettes, i.e. the one it has been adapted to. Moreover, there are thermocyclers in which the heat block can be replaced by the user depending on which plate or cuvette type needs to be thermally cycled. Such replacement procedure, however, is rather inconvenient, raises instrument handling costs, and generates the undesired risk of damaging the thermocycler or the heat block during the replacement procedure. Also a recalibration of the newly assembled thermocycler after replacement of the heat block is required in order to ensure that the measured temperatures do match the actual temperature of the operational surface receiving the wells or cuvettes, which—again—is rather inconvenient and raises instrument handling costs.

Finally, in order to speed-up transition times between the different temperature levels during PCR for achieving a decrease in heating and cooling time and, thus, for achieving an efficient and cost effective process and an increase in thermal cycling throughput, different kinds of heat sinks have been used within thermal units of commonly known thermal cycling devices, such as heat sinks with particular fin arrangements, or also heat sinks based on heat pipe and vapor chamber technology. For example, EP 3 524 353 A1 teaches a device for thermocycling biological samples, which device provides a heat pump for heating and cooling samples. However, this device is not suitable for thermocycling a high quantity of samples in short cycling intervals and therefore provides only a small throughput of samples. Accordingly, the desire still exists to further increase thermal cycling throughput by optimizing heating and cooling times during thermal cycling. Thus, due to these and other problems and disadvantages, the known concepts as presented above cannot fulfill the needs of users nowadays and, thus, do not provide satisfying solutions. Therefore, the general need exists in the present technical field to provide improved thermal cycling devices with optimized heating and cooling times during thermal cycling, and comprising thermal units which can be monitored after assembly and which can be easily replaced by a field service engineer in case of failure or defect.

SUMMARY OF THE DISCLOSURE

Accordingly, the present disclosure provides a thermal unit for simultaneous thermal cycling of a plurality of samples, with at least one thermal block and a cooling structure, the thermal block comprising at least one thermoelectric energy converter and a heat transfer plate attached to the thermoelectric energy converter for dissipation of thermal energy away from the thermoelectric energy converter, and the cooling structure comprising a heat sink, at least one air fan and an exhaust air duct, wherein
the heat sink is connected to the heat transfer plate on a first side and is exposed to the air fan on a second side, with the air fan providing a stream of intake air towards the second side of the heat sink, and
the exhaust air duct guides a stream of exhaust air away from the second side of the heat sink, with the stream of intake air and the stream of exhaust air being structurally separated from each other.

Also provided is a device for simultaneous thermal cycling of a plurality of samples in a dPCR consumable, including
a housing, and
at least one thermal unit, as described herein, secured within the housing, wherein the exhaust air duct of each thermal unit is formed in part by the second side of the heat sink and a guide plate and in part by the guide plate and a duct cover plate.

Finally, the disclosure provides a method for simultaneous thermal cycling of a plurality of samples, including the steps of
providing a device as described herein, with each thermal unit comprising a plurality of thermal blocks, and
performing a thermocycling protocol under feedback-control by a computer, preferably wherein the thermocycling protocol comprises nucleic acid amplification, wherein the plurality of thermal blocks is operated in a non-overlapping power consumption manner.

DETAILED DESCRIPTION

Figure 1:
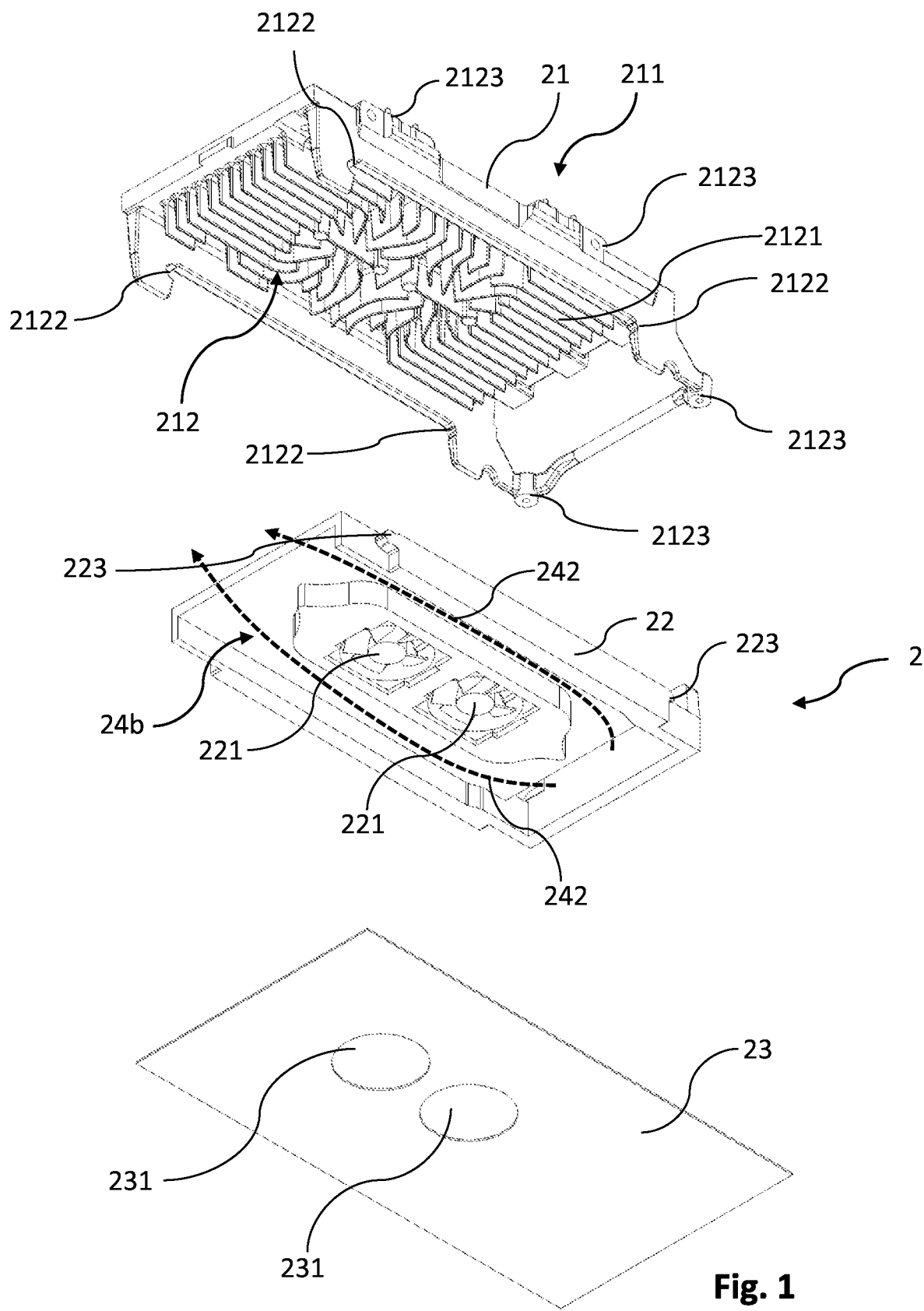
FIG. 1 is a conceptual exploded view of a cooling structure of a thermal unit according to an embodiment of the present disclosure.

The present disclosure addresses the above described problems of the known prior art and significantly improves thermal cycling of a large number of reaction vessels for dPCR. According to a first aspect of the present disclosure, a thermal unit for simultaneous thermal cycling of a plurality of samples is provided, with at least one thermal block and a cooling structure. The thermal block comprises at least one thermoelectric energy converter and a heat transfer plate attached to the thermoelectric energy converter for dissipation of thermal energy away from the thermoelectric energy converter. The cooling structure comprises a heat sink, at least one air fan and an exhaust air duct. The heat sink is connected to the heat transfer plate on a first side and is exposed to the air fan on a second side, with the air fan providing a stream of intake air towards the second side of the heat sink. The exhaust air duct guides a stream of exhaust air away from the second side of the heat sink, with the stream of intake air and the stream of exhaust air being structurally separated from each other. Thus, the thermal unit according to the disclosure comprises two main assemblies: at least one thermal block for heating or cooling of a plurality of samples and a cooling structure for removing thermal energy away from the thermal unit.

The thermal block comprises at least one thermoelectric energy converter which is a device transferring electric energy into thermal energy. Here, the thermoelectric energy converter can either heat or cool. For example, the thermoelectric energy converter can be a Peltier element, also known as thermoelectric cooler, TEC. Such a Peltier element transforms electrical energy into heat or cold. The thermoelectric energy converter is the element which actively heats or cools the plurality of samples, wherein the thermoelectric energy converter is an element that comprises two opposite sides. One of these opposite sides heats up, and the opposite side cools down during operation of the thermoelectric energy converter. Which of these opposite sides actually heats up depends on an operating mode of the thermoelectric energy converter. By changing its operating mode, especially by changing the direction of current flow, the side which is heated up can be switched. One side of the thermoelectric energy converter is thermally connected to the plurality samples. If the samples are to be heated up during thermal cycling, the side of the thermoelectric energy converter thermally connected to the samples is heated up. The opposite side of the thermoelectric energy converter cools down in this operation mode. If the samples are to be cooled down during thermal cycling, the side thermally connected to the samples is cooled down. In this operation mode the opposite side of the thermoelectric energy converter heats up. The thermal energy created on the opposite side to the side which is thermally connected to the samples has to be directed away from the thermoelectric energy converter. In this regard, the cooling structure of the thermal unit according to the disclosure is provided to remove the thermal energy created during the cooling of the samples. The thermal block comprises a heat transfer plate which is connected to the thermoelectric energy converter to transfer/remove this thermal energy from the thermal unit.

The cooling structure comprises several elements. One of these elements is a heat sink which is thermally connected to the heat transfer plate of the thermal block. The heat sink is an element which receives thermal energy created by the thermoelectric energy converter and transferred by the heat transfer plate, and is made of material which has a good thermal conductivity. The thermal energy transferred by the heat transfer plate dissipates into the heat sink. The heat sink itself is heated up by this dissipated thermal energy, wherein the thermal energy within the heat sink has to be further removed from the thermal unit. The heat sink is made from a thermally conductive material, e.g. casted and machined aluminum, and is used for transferring the dissipated heat away from the thermoelectric energy converter to the ambient environment outside of the thermal unit. In addition, the heat sink can be used as base plate and incorporates the mechanical interfaces to ensure correct positioning and fixation of the components of the thermal unit. Now, in order to assist the removal of thermal energy from the heat sink, at least one air fan is provided. This air fan provides a stream of intake air towards the second side of the heat sink. This second side of the heat sink is opposite to the side of the heat sink which is thermally connected to the heat transfer plate of the thermal block. The stream of intake air is warmed up by the thermal energy of the heat sink and, therefore, guides this thermal energy away from the heat sink. An exhaust air duct is provided to guide the stream of intake air after it has absorbed the thermal energy from the heat sink. After absorbing the thermal energy by the stream of intake air, the same if referred to as stream of exhaust air, since it no longer exhibits the properties of intake air, such as ambient temperature, but exhibits different properties, such as increased temperature. Thus, the temperature of the stream of exhaust air is higher than the temperature of the stream of intake air, since it has absorbed the thermal energy from the heat sink.

In order to remove the stream of exhaust air from the thermal unit, an exhaust air duct is provided. The exhaust air duct guides a stream of exhaust air away from the second side of the heat sink. The exhaust air duct guides the stream of exhaust air out of the thermal unit in a controlled way. According to the disclosure, the stream of intake air and the stream of exhaust air are structurally separated from each other to provide a controlled guiding of the thermal energy out of the thermal unit. The structural separation between the stream of intake air and the stream of exhaust air is primarily implemented by the exhaust air duct. Optionally, further elements can be provided in order to separate the stream of exhaust air from the stream of intake air. An advantage of such structural separation of the two streams of air according to the disclosure is that the dissipation of thermal energy away from the thermal block respectively the heat sink is provided with a very high degree of efficiency. With such structural separation between the stream of intake air and the stream of exhaust air, it can be ensured that the stream of intake air impacts the heat sink with an optimal low ambient temperature. A stream of air with a low temperature can absorb a higher amount of thermal energy than a stream of air with a higher temperature, such as a stream of air already heated by crossing exhaust air. The gradient between the temperature of the intake air and the temperature of the heat sink is larger for low temperature intake air. By separation of the two streams of air it can be ensured that these two streams do not mix up, i.e. that the stream of intake air is not heated up by mixing with the stream of exhaust air. Since the thermal cycling of samples for dPCR has to be done in short intervals of heating respectively cooling, a big amount of thermal energy accumulates in a short time within the heat sink and has to be removed from the thermal unit efficiently. Thus, the structural separation of the stream of intake air from the stream of exhaust air as presented by the present disclosure is especially useful for thermal units with the need to exhibit high heating and cooling performance.

According to a specific embodiment of the present disclosure, the stream of exhaust air is guided substantially orthogonal to the stream of intake air, wherein at least a part of the stream of exhaust air can be guided around the at least one air fan by means of the exhaust air duct. In this embodiment, the air fan is positioned in a way such that it guides the stream of intake air essentially orthogonal in relation to the heat sink and the heat transfer plate. Accordingly, the stream of intake air is directed towards the heat sink with an angle of about 90 degrees in relation to a longitudinal axis of the heat sink, and is deviated by the same 90 degrees after impinging on the heat sink. After this deviation, the stream of intake air flows essentially parallel to the longitudinal axis of the heat sink, i.e. parallel to the longitudinal orientation of the heat sink and the heat transfer plate. During this parallel intake air flow, the stream of passing air heats up by receiving thermal energy from the heat sink. By taking up thermal energy from the heat sink, the deviated stream of intake air is heated up, thereby becoming a stream of exhaust air which carries the heat away from the heat sink. Due to the deviation of flow direction, the stream of exhaust air flows substantially orthogonal to the stream of intake air as provided by the air fan in the first place. Based on the described divergence of streams of intake air and exhaust air, the directions of these streams would cross each other. In order to prevent such crossing, and, thus, a mixing of air between these two streams, at least one stream is bypassed while its direction crosses the direction of the other stream. In the described embodiment, the stream of exhaust air is guided around the at least one air fan and, thus, the stream of intake air, for example by means of the exhaust air duct. Here, the exhaust air duct structurally separates both streams of air from each other. The exhaust air duct typically guides the stream of exhaust air by means of duct walls which border the stream of exhaust air.

According to another specific embodiment of the present disclosure, the heat sink comprises a cooling fin structure at least on its second side, wherein the cooling fins can protrude from the second side of the heat sink substantially in parallel to the stream of intake air provided by the air fan. Also, the cooling fins can be provided in the form of a swage fin structure. In this embodiment, the heat sink comprises a cooling fin structure to increase the surface available for dissipating and transferring thermal energy to the stream of air provided by the at least one air fan. The cooling fin structure is typically positioned on the second side of the heat sink, i.e. the side of the heat sink opposite to the first side which is connected to the heat transfer plate, to be directed to the stream of intake air provided by the air fan. It is also possible to provide additional cooling fin structure on another part of the heat sink, for example on parts of the heat sink which neither constitute the first or the second side of the heat sink. In further detail, the cooling fins protrude from the second side of the heat sink. These cooling fins have a typical plate-like fin form with two big opposite main surfaces, small side surfaces and a small end face. The side opposite to the end face is connected with the heat sink. The main surfaces of the cooling fins provide a big surface area for an effective transfer of thermal energy to the cooling stream of intake air. The cooling fins guide the stream of intake air/exhaust air between their main surfaces, i.e. the cooling fins guide the stream of intake air provided by the air fan along the heat sink. According to a specific embodiment, the cooling fins can be provided in the form of a plate fin structure, or, alternatively as a pin fin structure. An effective way to manufacture a heat sink with a cooling fin structure is swaging both elements together as one piece. A swaged cooling fin structure comprises lifting bevels. A swaged heat sink with a cooling fin structure can efficiently be made of metals with a good thermal conductivity for example copper, copper alloys, aluminum or aluminum alloys. Alternatively, the heat sink with a cooling fin structure can also be manufactured by casting, or the like.

According to a further specific embodiment of the present disclosure, the cooling fin structure of the heat sink, at least in the area of the air fan, is arranged in a star-shaped manner guiding the intake air provided by the air fan towards lateral sides of the heat sink. In this particular embodiment, the cooling fin structure for one air fan has the shape of a star when viewed from a plan view on the second side of the heat sink. The stream of intake air provided by the air fan reaches the second side of the heat sink orthogonal to this second side, i.e. it impinges directly onto the second side. Thus, the cooling fin structure provided in a star-shaped manner spreads the impinging stream of intake air into a multitude of lateral directions. With such spreading, the cool intake air is distributed all over the cooling fin structure and, thus, the heat sink. Therefore, the heat transfer from the heat sink to the impinging stream of intake air is very effective. In further detail, the cooling fin structure can be particularly star-shaped at the location where the stream of intake air impinges on the second side of the heat sink. In areas near the lateral sides of the heat sink, the cooling fin structure may be arranged in form of parallel plate fins, in order to guide the stream of intake air/exhaust air effectively towards the lateral sides of the heat sink.

According to another specific embodiment of the present disclosure, the first side of the heat sink is opposite to the second side of the heat sink, i.e. facing away from the air fan. In further detail, the first side of the heat sink, which is thermally connected to the heat transfer plate of the thermal block, is opposite to the second side of the heat sink which faces the stream of intake air provided by the air fan. With the first side and the second side being arranged opposite to each other but in parallel with each other, the transfer of heat from the thermal block to the stream of cooling air is very effective. It is also possible to arrange the second side in relation to the first side in a certain angle, for example a right angle. Such an orthogonal arrangement of first and second side of the heat sink can have certain advantages if there is not enough available space within the thermal unit to arrange the two sides opposite to each other.

According to a specific embodiment of the present disclosure, the at least one air fan is arranged within a through hole in a guide plate of the cooling structure, wherein the exhaust air duct can be formed by the second side of the heat sink and the guide plate. Accordingly, the thermal unit can comprise a guide plate which is part of the cooling structure. Such guide plate can be provided to more effectively guide the stream of intake air and/or the stream of exhaust air. In further detail, the guide plate can at least partially cover the second side of the heat sink and the cooling fin structure. The guide plate further provides a through hole in or next to which the at least one air fan is positioned. The stream of intake air is aspirated by the air fan and guided through the through hole within the guide plate in direction to the second side of the heat sink, as described above. The guide plate can also provide means to assemble the at least one air fan. The second side of the heat sink, potentially provided with a cooling fin structure, and the guide plate can form at least a part of the exhaust air duct together. In this part of the exhaust air duct, the stream of exhaust air is guided between the heat sink and the guide plate.

Alternatively or additionally, the exhaust air duct can be formed by the guide plate and a duct cover plate. Here, it is possible to provide a duct cover plate which is connected to the guide plate. Thereby, at least a part of the exhaust air duct can be formed by this side of the guide plate, which is opposite to the side of the guide plate facing the heat sink, with the duct cover plate at least covering a part of the guide plate. The guide plate and the duct cover plate provide in combination a kind of channel through which the stream of exhaust air is guided. The shape of the guide plate ensures that the stream of intake air and the stream of exhaust air do not get mixed up with each other. Since the duct cover plate covers at least a part of the guide plate, the duct cover plate also comprises a through hole for the stream of intake air respectively for the at least one air fan. The exhaust air duct can either be provided by the second side of the heat sink in combination with the guide plate or the exhaust air duct can be provided by the guide plate in combination with the duct cover plate. Furthermore, it is possible that the exhaust air duct is provided by both of these possibilities in combination.

Further alternatively or additionally, the heat sink and the guide plate can be connected by a snap-fit connection. A snap fit connection is suitable for a quick and reliable assembly of both components. In this regard, and in the form of an alternative or additional embodiment, the guide plate can be made of elastic material, for example of plastics or metal sheet. The guide plate can also be provided with tongue-like elements which allow an elastic deformation as means for a snap fit connection with the heat sink. Guide plate and heat sink can of course also be connected with each other in a different way, for example with an adhesive connection, such as by means of glue or the like, or by means of additional connecting elements like bolts or screws.

According to another specific embodiment of the present disclosure, the thermal unit further comprises an air intake duct for directing ambient air towards the air fan, wherein the air intake duct is structurally separated from the exhaust air duct, such as by means of a separating wall. In this embodiment, an air intake duct is provided as additional component of the thermal unit in order to guide ambient air to the air fan and the heat sink. The air intake duct can be designed as a kind of channel between the environment of the thermal unit and the air fan. The air intake duct is structurally separated from the exhaust air duct to ensure that the stream of intake air e.g. can be realized by one or more separating walls.

According to a specific embodiment of the present disclosure, the at least one thermal block further comprises at least one top plate with a substantially planar top side for thermal contact with a dPCR consumable, wherein the at least one thermoelectric energy converter is attached to a bottom side of the top plate opposite to its top side, wherein a clamping mechanism can be provided for sandwiching the top plate, the thermoelectric energy converter and the heat transfer plate together, for providing thermal contact between the top plate and the thermoelectric energy converter and/or between the thermoelectric energy converter and the heat transfer plate. In this embodiment, the at least one thermal block comprises a top plate provided to contact and heat or cool a dPCR consumable with samples. Such top plate can have a substantial planar topside. In this regard, such a planar topside can be optimal for excellent heat transfer from and to a dPCR consumable which usually exhibits a planar underside. The top plate can be made of material with a high thermal conductivity, for example copper. The bottom side of the top plate can be thermally connected to the thermoelectric energy converter. During operation of the thermal unit, thermal energy has to be transferred from the thermoelectric energy converter to both top plate and heat transfer plate. Accordingly, a clamping mechanism can be provided in order to urge these three elements together. The use of a clamping mechanism ensures that there is a reliable large-area contact and, therefore, an efficient heat transfer between these elements. For example, the clamping mechanism can be made of metallic elements fixed together by screw joints or the like. Optionally, the clamping mechanism can be spring-loaded. Such a spring-loaded embodiment of a clamping mechanism can efficiently compensate heat expansion of the three elements during operation. Furthermore, a spring-loaded clamping mechanism can ensure an even distribution of the clamping force without the need of any adjustment while assembling. A spring-loaded clamping mechanism can also reduce the mechanical stress on the thermoelectric energy converter, since its clamping force is constant during operation. Accordingly, and based on such clamping mechanism, the thermoelectric energy converter is sandwiched between the top plate and the heat transfer plate.

According to a further specific embodiment of the present disclosure, the thermal block further comprises at least one heat transfer medium between the top plate and the thermoelectric energy converter and/or between the thermoelectric energy converter and the heat transfer plate, for example in the form of a heat transfer foil, or any other kind of heat transfer medium. In this embodiment, the heat transfer within the thermal block is further improved by using one or more heat transfer media between the elements. Such a heat transfer medium be a heat transfer foil. The heat transfer medium has a good thermal conductivity and can fill up little gaps between the elements to be thermally connected. Therefore the heat transfer medium reduces the thermal resistance between these elements. As an alternative to a heat transfer foil, or also as an additional means, heat transfer paste can also be used in order to reduce the thermal resistance within the thermal block.

According to a specific embodiment of the present disclosure, the thermal block further comprises at least one temperature sensor in or at the top plate for temperature control, wherein at least two temperature sensors can be provided, for temperature control as well as for process control based on redundancy. In this embodiment, at least one temperature sensor is provided, which sensor is connected to the top plate. Here, such temperature sensor can be placed within the top plate. The temperature sensor determines the temperature of the top plate. In order to improve reliability of the thermal block, two temperature sensors can optionally be provided, wherein one of these temperature sensors determines the temperature as a redundant sensor for process control, thereby increasing measuring certainty.

According to another specific embodiment of the present disclosure, the thermal block further comprises an electronics board for support of the thermoelectric energy converter and the temperature sensor, such as in the form of a printed circuit board assembly, wherein the electronics board can be configured for calibrating temperature deviation compensation and for storing the respective calibration data in a built-in memory. Also the electronics board can comprise an analog-digital converter for converting an analog temperature signal of any temperature sensor into a digital signal. In this embodiment, an electronics board is provided to control the thermoelectric energy converter. The electronics board is connected to the at least one temperature sensor and receives its signals as an input for controlling the operation of the thermoelectric energy converter. Since the signals of the temperature sensor are usually analog signals, the electronics board can provide an analog to digital converter to create a digital signal based on the analog output of the temperature sensor. For example, the electronics board can be a printed circuit board, PCB, or printed circuit board assembly, PCBA. In order to compensate the tolerances of the analog temperature sensors, measuring section, thermoelectric energy converter and the assembly process, a calibration needs to be performed once after assembly, to ensure that the temperature value used to control the thermoelectric energy converter matches the actual temperature of the top plate within tight tolerances. The electronics board attached to the thermal block has a memory to store such individual calibration data. The thermal block together with its individual calibration data is designed as spare part and can be easily attached to and removed from the thermal unit during assembly or in the field in case of a replacement is needed.

According to a specific embodiment of the present disclosure, the thermal block constitutes a replaceable self-contained entity within the thermal unit. In this embodiment, which can comprise the features of the embodiments as described above, the thermal block is a self-contained entity which can easily be replaced. Since there is a requirement for tight temperature tolerances for thermocycler of samples during a dPCR, the thermal block has to be calibrated before operation of the thermal unit. Such calibration process is usually complex and rather difficult to perform in the field. With the thermal block designed a self-contained entity, no calibration process is necessary after replacing the thermal block. A calibration of such a self-contained entity can already be run after its assembly in the laboratory or factory, where the calibration process of the thermal block is more reliable and easier to perform.

According to another specific embodiment of the present disclosure, the heat sink is configured to receive a plurality of thermal blocks, for example six thermal blocks. In this embodiment, the heat sink is designed to be connected with a plurality of thermal blocks. Thus, the thermal unit can comprise more than one thermal blocks. These thermal blocks can be assembled to the heat sink next to each other so that their top plates form one big common top plate. Also, it is possible to place several thermal blocks next to each other with gaps between their top plates. In this embodiment, one cooling structure is provided to remove thermal energy from a plurality of thermal blocks.

According to a second aspect of the present disclosure a device for simultaneous thermal cycling of a plurality of samples in a dPCR consumable is provided, including a housing, and at least one thermal unit according to any one of the embodiments described above secured within the housing, wherein the exhaust air duct of each thermal unit is formed in part by the second side of the heat sink and a guide plate and in part by the guide plate and a duct cover plate. The duct cover plate can be fixed in relation to the housing. A device according to the disclosure comprises at least one thermal unit according to one or more of the embodiments described above. The device according to the disclosure also comprises further components. The device comprises a housing which encloses at least part of the device. The housing can be composed of several elements. These elements are parts of the housing. One of these parts of the housing can be a duct cover plate, which is assembled to the guide plate of the at least one thermal unit. The heat sink of the cooling structure can serve as an assembly base for the device. The heat sink can provide mechanical interfaces to connect the other parts of the device for example the housing, the thermal block and other components. The mechanical interfaces ensure correct positioning and fixation of the components of the device.

According to a third aspect of the present disclosure, a method for simultaneous thermal cycling of a plurality of samples is provided, including the steps of providing a device as described above, with each thermal unit comprising a plurality of thermal blocks, and performing a thermocycling protocol under feedback-control by a computer. Here, the thermocycling protocol can comprise nucleic acid amplification, wherein the plurality of thermal blocks can be operated in a non-overlapping power consumption manner. The maximum power consumption of the device according to the disclosure is limited by the provided power of the electrical installation of the environment, for example in the laboratory. The power consumption of the thermoelectric energy converters depends on the state of the thermocycling process, and especially depends on the current temperature, the target temperature and the ramp rate. During ramping up and ramping down, the power consumption is usually high. Between the ramps, when the temperature is kept constant, the power consumption is usually low. In case all thermoelectric energy converters would be run simultaneously, this would lead to an addition of the power consumption of all converters. During ramping up and ramping down, such addition would lead to an undesired high power consumption and would be significantly limited by the power provided by the electric installation. Thus, a simultaneous operation of the plurality of thermoelectric energy converters could only be realized for a small number of thermoelectric energy converters. In this case, only a small number of samples could be treated with thermal cycling at the same time. The throughput of the device would therefore be rather low. Here, however, and according to the disclosure, the thermoelectric energy converters and the thermal blocks can be operated in a manner such that an overlapping of the power peaks during ramping is prevented. This can be realized by particularly shifting the timing profile for operating the particular thermoelectric energy converters, i.e. during ramping up of one thermoelectric energy converter with a high power consumption, another thermoelectric energy converter is operated at a constant temperature with low power consumption. The result of such operation is that the addition of the power consumption of the thermoelectric energy converters is lower than for simultaneous operation with high power consumptions. In case the device as described above is operated according to a method according to the disclosure, the power provided by the electric installation is utilized in a very effective way. With the method according to the disclosure, a higher number of thermal blocks can be operated at the same time with a certain amount of available power compared to simultaneous ramping up and ramping down of the thermal blocks. In order to control and run the inventive method, a thermocycling protocol under feedback-control by a computer is provided. The computer is programmed with a software tool that calculates the required timely offset of the profiles of the different thermal blocks.

According to a specific embodiment of the method according to the present disclosure, the method further comprises the step of calculating a timely offset of a peak power consumption of one thermal block during ramping. Another possibility is to provide holding times to a peak power consumption of any other thermal block during ramping and/or holding times, wherein the operating of the plurality of thermal blocks in a non-overlapping power consumption manner is based on such timely offset. In this embodiment, the method comprises the step of calculating a timely offset of the peak power consumption between the different thermal blocks respectively thermoelectric energy converters. This calculation of a timely offset is done by a computer or the electric board provided by one or more thermal units of the device. The timely offset can be calculated between the peaks of power consumption, which occur during ramping or alternatively can be calculated between holding times, when the temperature is kept constant and the power consumption is low. According to this embodiment of the method, there is always a timely offset between times of maximum power consumption of the respective thermal blocks. In this way, the device is operated in a non-overlapping power consumption manner and the total power consumption of the device is kept as low as possible.

According to an alternative specific embodiment one dPCR consumable containing samples can also be supplied by two thermal blocks, wherein the thermal unit comprises six thermal blocks in total. Thus, the six thermal blocks form three pairs of two thermal blocks, respectively, to hold three consumables in total. The two thermal blocks of one pair are operated simultaneously without a timely offset in order to apply the same temperature to the whole consumable at any time. The timely offset is calculated between the pairs of thermal blocks, which are operated in a non-overlapping power consumption manner. Thus, the method further comprises the step of calculating a timely offset of a peak power consumption of a pair of thermal blocks during ramping. Another possibility is to provide holding times to a peak power consumption of any other pair of thermal blocks during ramping and/or holding times, wherein the operating of the plurality of pairs of thermal blocks in a non-overlapping power consumption manner is based on such timely offset. In this embodiment, the method comprises the step of calculating a timely offset of the peak power consumption between the different pairs of thermal blocks respectively pairs of thermoelectric energy converters. This calculation of a timely offset is done by a computer or the electric board provided by one or more thermal units of the device. The timely offset can be calculated between the peaks of power consumption, which occur during ramping or alternatively can be calculated between holding times, when the temperature is kept constant and the power consumption is low. According to this embodiment of the method, there is always a timely offset between times of maximum power consumption of the respective pairs of thermal blocks. In this way, the device is operated in a non-overlapping power consumption manner and the total power consumption of the device is kept as low as possible.

As used herein and also in the appended claims, the singular forms "a", "an", and "the" include plural reference unless the context clearly dictates otherwise. Similarly, the words "comprise", "contain" and "encompass" are to be interpreted inclusively rather than exclusively; that is to say, in the sense of "including, but not limited to". Similarly, the word "or" is intended to include "and" unless the context clearly indicates otherwise. The terms "plurality", "multiple" or "multitude" refer to two or more, i.e. 2 or >2, with integer multiples, wherein the terms "single" or "sole" refer to one, i.e. =1. Furthermore, the term "at least one" is to be understood as one or more, i.e. 1 or >1, also with integer multiples. Accordingly, words using the singular or plural number also include the plural and singular number, respectively. Additionally, the words "herein," "above,", "previously" and "below" and words of similar import, when used in this application, shall refer to this application as a whole and not to any particular portions of the application.

Furthermore, certain terms are used for reasons of convenience and are not intended to limit the disclosure. The terms "right", "left", "up", "down", "under" and "above" refer to directions in the figures. The terminology comprises the explicitly mentioned terms as well as their derivations and terms with a similar meaning. Also, spatially relative terms, such as "beneath", "below", "lower", "above", "upper", "proximal", "distal", and the like, may be used to describe one element's or feature's relationship to another element or feature as illustrated in the figures. These spatially relative terms are intended to encompass different positions and orientations of the devices in use or operation in addition to the position and orientation shown in the figures. For example, if a device in the figures is turned over, elements described as "below" or "beneath" other elements or features would then be "above" or "over" the other elements or features. Thus, the exemplary term "below" can encompass both positions and orientations of above and below. The devices may be otherwise oriented (rotated 90 degrees or at other orientations), and the spatially relative descriptors used herein interpreted accordingly. Likewise, descriptions of movement along and around various axes include various special device positions and orientations.

To avoid repetition in the figures and the descriptions of the various aspects and illustrative embodiments, it should be understood that many features are common to many aspects and embodiments. The description of specific embodiments of the disclosure is not intended to be exhaustive or to limit the disclosure to the precise form disclosed. While the specific embodiments of, and examples for, the disclosure are described herein for illustrative purposes, various equivalent modifications are possible within the scope of the disclosure, as those skilled in the relevant art will recognize. Specific elements of any foregoing embodiments can be combined or substituted for elements in other embodiments. Furthermore, while advantages associated with certain embodiments of the disclosure have been described in the context of these embodiments, other embodiments may also exhibit such advantages, and not all embodiments need necessarily exhibit such advantages to fall within the scope of the disclosure as defined by the appended claims. Omission of an aspect from a description or figure does not imply that the aspect is missing from embodiments that incorporate that aspect. Instead, the aspect may have been omitted for clarity and to avoid prolix description. In this context, the following applies to the rest of this description: If, in order to clarify the drawings, a figure contains reference signs which are not explained in the directly associated part of the description, then it is referred to previous or following description sections. Further, for the reason of lucidity, if in a section of a drawing not all features of a part are provided with reference signs, it is referred to other sections of the same drawing. Like numbers in two or more figures represent the same or similar elements.

The following examples are intended to illustrate various specific embodiments of the present disclosure. As such, the specific modifications as discussed hereinafter are not to be construed as limitations on the scope of the present disclosure. It will be apparent to the person skilled in the art that various equivalents, changes, and modifications may be made without departing from the scope of the present disclosure, and it is thus to be understood that such equivalent embodiments are to be included herein. Further aspects and advantages of the present disclosure will become apparent from the following description of particular embodiments illustrated in the figures.

Reference(s) to "embodiment(s)" throughout the description which are not under the scope of the appended claims merely represent possible exemplary executions and are therefore not part of the present disclosure.

EXAMPLES

FIG. 1 shows a conceptual exploded view of a cooling structure 2 of a thermal unit 1 according to an embodiment of the present disclosure. The illustrated embodiment of the cooling structure 2 comprises three main components, heat sink 21, guide plate 22 and duct cover plate 23.

The topmost component in the illustration of FIG. 1 is the heat sink 21. The heat sink 21 is made of metal with a high thermal conductivity, for example aluminum or an aluminum alloy. The heat sink 21 is manufactured by swaging or the like. The heat sink 21 comprises a first side 211 which is intended for a connection with the thermal block 3 of the thermal unit 1. The heat sink 21 comprises a second side 212 which is opposite to the first side and is, in FIG. 1, directed towards the viewer. The second side 212 of the heat sink 21 is intended to be connected with the guide plate 22 illustrated as component in the middle of the exploded view of FIG. 1. The cooling fin structure 2121 is arranged on the second side 212 of the heat sink 21. The cooling fin structure 2121 comprises a plurality of cooling fins, which protrude from the second side 212. In the area around the middle of the second side 212, the cooling fins of the cooling fin structure 2121 are arranged in a star-shaped manner. In the area of the cooling fin structure 2121 where the cooling fins are arranged in the previously mentioned star-shaped manner, also referred to as star-shaped area, the stream of intake air provided by the two air fans 221 impacts or impinges on the second side 212 of the heat sink 21. The stream of intake air is then distributed and guided by the cooling fins to the lateral sides of the heat sink 21. In the area left and right from the star-shaped area, the cooling fins are arranged parallel to each other. In these areas neighboring the star-shaped area, the cooling fins guide the stream of intake air/exhaust air straight to the lateral sides of the heat sink 21.

The heat sink 21 has the general function to absorb and dissipate thermal energy from one or more thermal blocks 3 not illustrated in FIG. 1. The thermal energy from the thermal blocks 3 is transferred to the heat sink 21 by its first side 211. A stream of intake air is provided by the two air fans 221 and impinges onto the second side 212 of the heat sink 21. The second side 212 and the cooling fin structure 2121 then redirect the stream of intake air in a way such that it then flows parallel to the second side 212. The stream of intake air receives thermal energy from the cooling fin structure 2121 and transports the same away and out of the cooling structure 2. The heat sink 21 is also implemented as an assembly base, in order to be able to fix further components thereon. Therefor, the heat sink 21 comprises several mechanical interfaces in order to ensure correct positioning and fixation of such other components. For example, the heat sink 21 comprises four snap interfaces 2122 which are mechanical interfaces for the connection of the heat sink 21 with the guide plate 22. The heat sink 21 furthermore comprises several connection interfaces 2123 which are also mechanical interfaces, intended to be connected with other components of the thermal unit 1 of the device 100. The heat sink 21 can also comprise further mechanical interfaces which are not described or illustrated in further detail.

In the middle of the exploded view of FIG. 1, the guide plate 22 is arranged. The guide plate 22 is intended for assembly with the heat sink 21. In an assembled state, the guide plate 22 covers the biggest part of the second side 212 of the heat sink 21. The guide plate 22 of the presently described embodiment carries at least one air fan in the form of two air fans 221. Here, however, any number of air fans can be used. Each of the air fans 221 is positioned in a respectively provided through hole. The air fans 221 aspirate ambient air and create a stream of intake air which flows through the through holes of the guide plate 22 in direction towards the second side 212 of the heat sink 21. Also, the guide plate 22 comprises four tappets 223 which are mechanical interfaces for the connection with the heat sink 21. The guide plate 22 and the heat sink 21 are connected to each other, for example by means of a snap fit connection. Such snap fit connection is provided by the combination of the four tappets 223 that snap into the respective snap interfaces 2122. The guide plate 22 also comprises a first part 24a and a second part 24b of the exhaust air duct.

Figure 2:
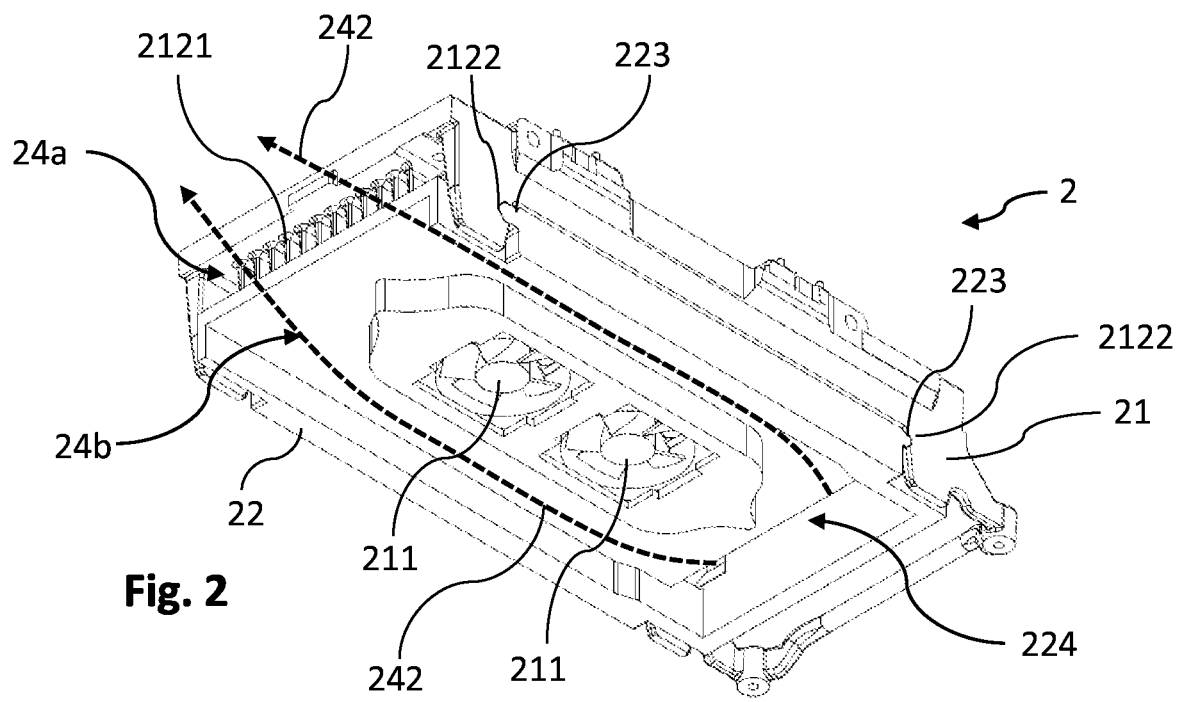
FIG. 2 is a conceptual perspective view of the assembled cooling structure of the thermal unit as shown in FIG. 1, illustrated from below, without duct cover plate.
Figure 3:
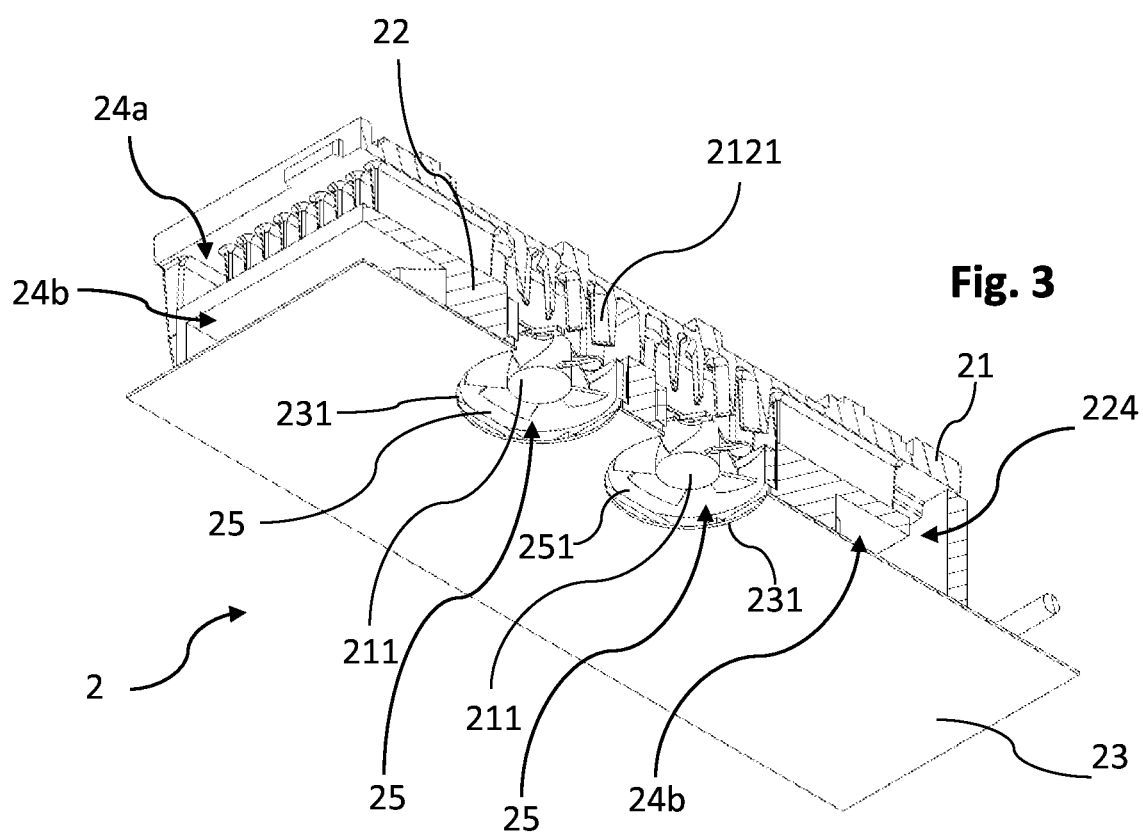
FIG. 3 is a conceptual sectional perspective view of the assembled cooling structure of the thermal unit shown in FIG. 1, illustrated from below.
Figure 4:
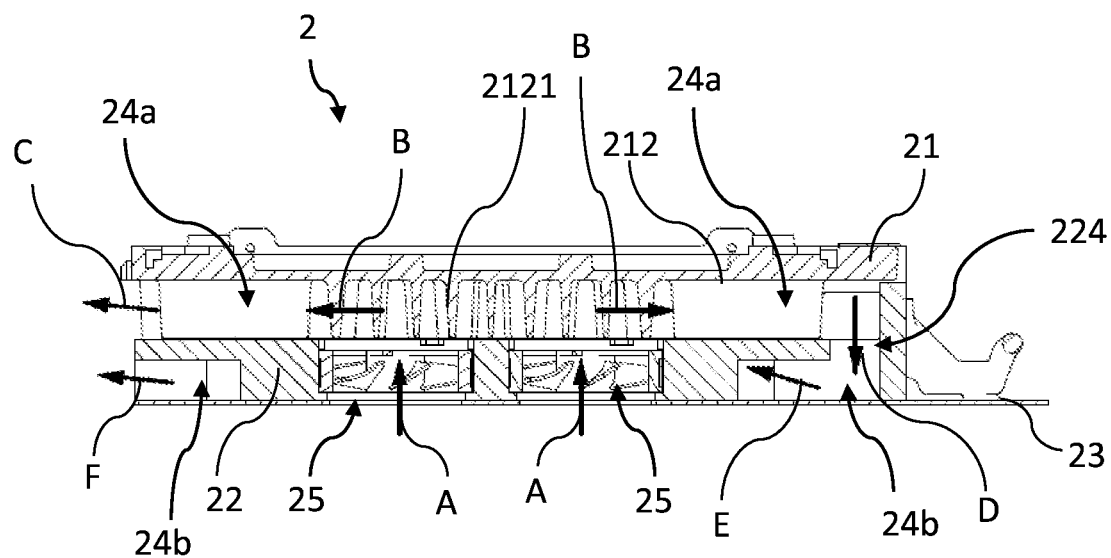
FIG. 4 is a conceptual sectional side view of the assembled cooling structure of the thermal unit shown in FIGS. 1 and 3.

The first part 24a of the exhaust air duct is only illustrated in FIGS. 2 to 4. The second part 24b of the exhaust air duct, as illustrated in FIG. 1, is provided by a recess within the guide plate 22 which is directed towards the viewer. This recess is positioned between the outer edges of the guide plate 22 and the part of the guide plate 22 which carries the two air fans 221. In the illustration of FIG. 1, the stream of exhaust air flows from the right side of the guide plate 22 around the two air fans 221 and the two through holes in direction of the left side of the guide plate 22 as symbolized by the two arrows 242. In the assembled state, the second part 24b of the exhaust air duct is covered by the duct cover plate 23 which is illustrated as the lowest component within the exploded view of FIG. 1. The duct cover plate 23 is a flat component which comprises two through holes 231. In an assembled state, these through holes 231 are positioned coaxially to the through holes in the guide plate 22. The stream of intake air is aspirated through the through holes 231 into the air fans 221. In the embodiment shown in FIG. 1, the guide plate 22 can be made of plastic material and the duct cover plate 23 can be made of stainless steel metal sheet. The duct cover plate 23 can be assembled to the heat sink 21 with connecting elements, for example with screws. The duct cover plate 23 is connected to one or more mechanical interfaces of the heat sink 21. The mechanical connection between the duct cover plate 23 and the heat sink 21 presses the duct cover plate 23 to the guide plate 22. This mechanical connection provides a sealing between the duct cover plate 23 and the guide plate 22 and therefore also seals the second part of the exhaust air duct 24b.

FIG. 2 shows a conceptual perspective view of the assembled cooling structure 2 of the thermal unit 1 as shown in FIG. 1. In FIG. 2, the heat sink 21 and the guide plate 22 are connected to each other with a snap fit connection between the tappets 223 and the snap interfaces 2122. For improved visibility of the second part 24b of the exhaust air duct, the duct cover plate 23 is omitted in FIG. 2. FIG. 2 shows that most of the area of the second side 212 of the heat sink 21 is covered by the guide plate 22. The guide plate 22 and the heat sink 21 together form the first part 24a of the exhaust air duct. Within the first part 24a of the exhaust air duct, the stream of exhaust air is guided by the cooling fin structure 2121 from the central part of the second side 212 of the heat sink 21 to the sides of the heat sink 21. The stream of exhaust air leaves the first part 24a of the exhaust air duct at a lateral side of the heat sink 21, which is directed towards the left side of FIG. 2. Another part of the stream of exhaust air leaves the first part 24a of the exhaust air duct at the right side of the heat sink 21 through the gap 224 within the guide plate 22. The path of the part of the stream of exhaust air flowing through the gap 224 is symbolized by the two arrows 242. After flowing through the gap 224, the exhaust air enters the second part 24b of the exhaust air duct. The exhaust air streams along the duct provided by the guide plate 22 in combination with the duct cover plate 23 and around the two air fans 221. The stream of exhaust air leaves the second part 24b of the exhaust air duct on the left side of the guide plate as illustrated in FIG. 2. The second part 24b of the exhaust air duct is adjacent to the exit of the first part 24a of the exhaust air duct. Thereby, the combined stream of exhaust air leaving the first part 24a of the exhaust air duct and the second part 24b of the exhaust air duct subsequently leaves the cooling structure 2 on the left side in FIG. 2. Thus, the total stream of exhaust air can easily be removed from the thermal unit 1 by further components, not illustrated in FIG. 2.

FIG. 3 shows a conceptual sectional perspective view of the assembled cooling structure 2 of the thermal unit 1 as shown in FIG. 1. In FIG. 3, the duct cover plate 23 is assembled to the cooling structure 2. In the sectional view in FIG. 3, the first part of the exhaust air duct 24a is clearly visible between the heat sink 21 and the guide plate 22. The second part 24b of the exhaust air duct is only partly visible, since most of it is covered by the duct cover plate 23. The sectional view in FIG. 3 shows the two intake air ducts 25 which are provided by a combination of the through holes 231 in the duct cover plate 23 and the guide plate 22. The intake air ducts 25 direct ambient air towards the air fans 221. The intake air ducts 25 are separated from the exhaust air duct 24a, 24b by the separating walls 251. Thereby, the stream of intake air is structurally separated from the stream of exhaust air within the cooling structure 2.

FIG. 4 shows a conceptual sectional side view of the assembled cooling structure 2 of the thermal unit 1 as shown in FIG. 1. In the sectional view in FIG. 4, the flow of intake air/exhaust air through the cooling structure 2 is illustrated by the arrows A to F. The stream of intake air coming from the ambient of the cooling structure 2 enters the cooling structure 2 via the air intake ducts 25 as symbolized by the arrows A. The stream of intake air is then aspirated by the two air fans 221 and is directed to the second side 212 of the heat sink 21. After the air intake ducts 25 and the air fans 221, the stream of intake air impinges onto the cooling fins structure 2121. The cooling fin structure 2121 then deviates the stream of intake air, i.e. directs the same from a direction orthogonal to the second side 112 of the heat sink 21, as symbolized by the arrows A, to a direction parallel to the second side 212, as symbolized by the arrows B. Part of the intake air is deviated through the cooling fin structure 2121 to the left-hand side of the heat sink 21 through the first part 24a of the exhaust air duct. On its way through the heat sink 21, the intake air takes away thermal energy from the heat sink 21, i.e. is warmed up and, thus, becomes exhaust air. This part of the exhaust air leaves the first part 24a of the exhaust air duct on the left-hand side, as symbolized by arrow C. Another part of the intake air is directed to the right-hand side of the heat sink 21 by another part of the first part 24a of the exhaust at duct. This part of the intake air is also warmed up on its way through the first part 24a of the exhaust air duct and becomes exhaust air, which part of the exhaust air flows through the gap 224 into the second part 24b of the exhaust air duct, as symbolized by arrow D. From the right-hand side of the second part 24b of the exhaust at duct, formed by the guide plate 22 and the duct cover plate 23, the exhaust air is directed to the left-hand side of the second part 24b of the exhaust at duct, as symbolized by arrow E. The exhaust air finally leaves the second part 24b of the exhaust at duct and the cooling structure 2 on the left-hand side, as symbolized by arrow F.

Figure 5:
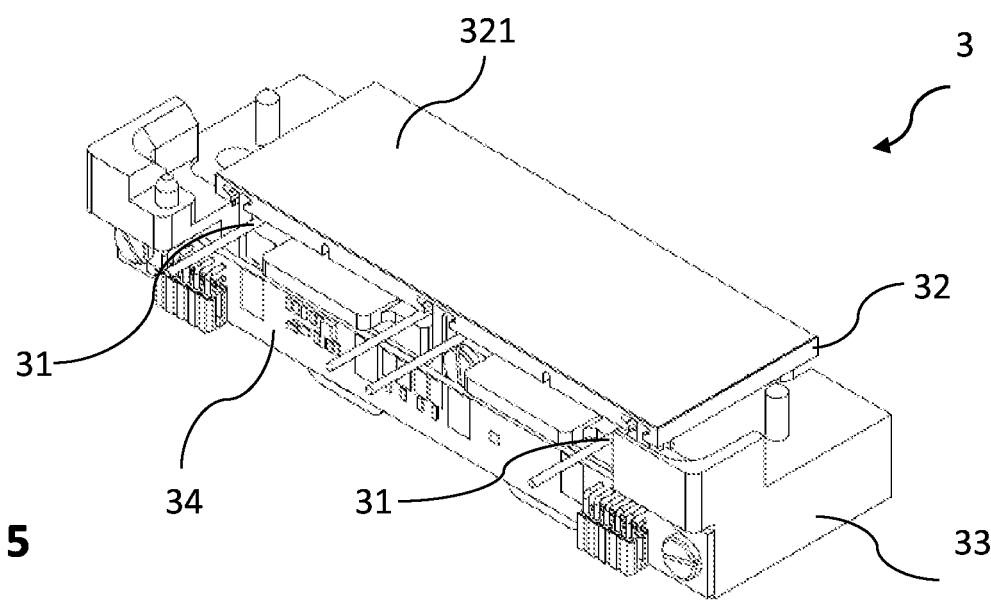
FIG. 5 is a conceptual perspective view of a thermal block of a thermal unit according to an embodiment of the present disclosure.

FIG. 5 shows a conceptual perspective view of a thermal block 3 of a thermal unit 1 according to an embodiment of the present disclosure. On top of the thermal block 3, top plate 32 is provided. The top plate 32 comprises a planar topside 321. This planar topside 321 is the area where consumables containing samples for thermal cycling are to be positioned. Since these consumables usually comprise a planar underside, excellent heat transfer between the planar topside 321 and the underside of the consumables can be ensured. The thermal block 3 illustrated in FIG. 5 comprises two thermoelectric energy converters 31 which are attached to the underside of the top plate 32. The two thermoelectric energy converters 31 are not visible in FIG. 5, since they are covered by the top plate 32. For example, the thermoelectric energy converters 31 can be Peltier elements, also known as Thermoelectric Coolers, TECs. Such TECs transform electrical energy into heat or cold. The top plate 32 can either be cooled or heated by the thermoelectric energy converters 31. On the side opposite to the connection with the top plate 32, the thermoelectric energy converters 31 are connected with the heat transfer plate 33. The heat transfer plate 33 transfers thermal energy from the thermoelectric energy converters 31 to the cooling structure 2, which is not illustrated in FIG. 5. The heat transfer plate 33 further comprises several connections, for example to connect the electronics board 34 to the thermal block 3. Such an electronics board 34 for support of the thermoelectric energy converter can be a printed circuit board assembly, PCBA, which can be connected with one or more temperature sensors in or at the top plate 32 and can be configured for calibrating temperature deviation compensation and for storing the respective calibration data in a built-in memory. Such an electronics board 34 is assembled at a side of the heat transfer plate 33 which is directed to the left side in FIG. 5. The heat transfer plate 33 in FIG. 5 is made of an aluminum alloy and, thus, comprises high heat conductivity. The top plate 32, the thermoelectric energy converters 31 and the transfer plate 33 can be fixed to each other by means of a clamping mechanism, which is also not illustrated in FIG. 5. Such a clamping mechanism can ensure constant connecting forces between the three components.

Figure 6:
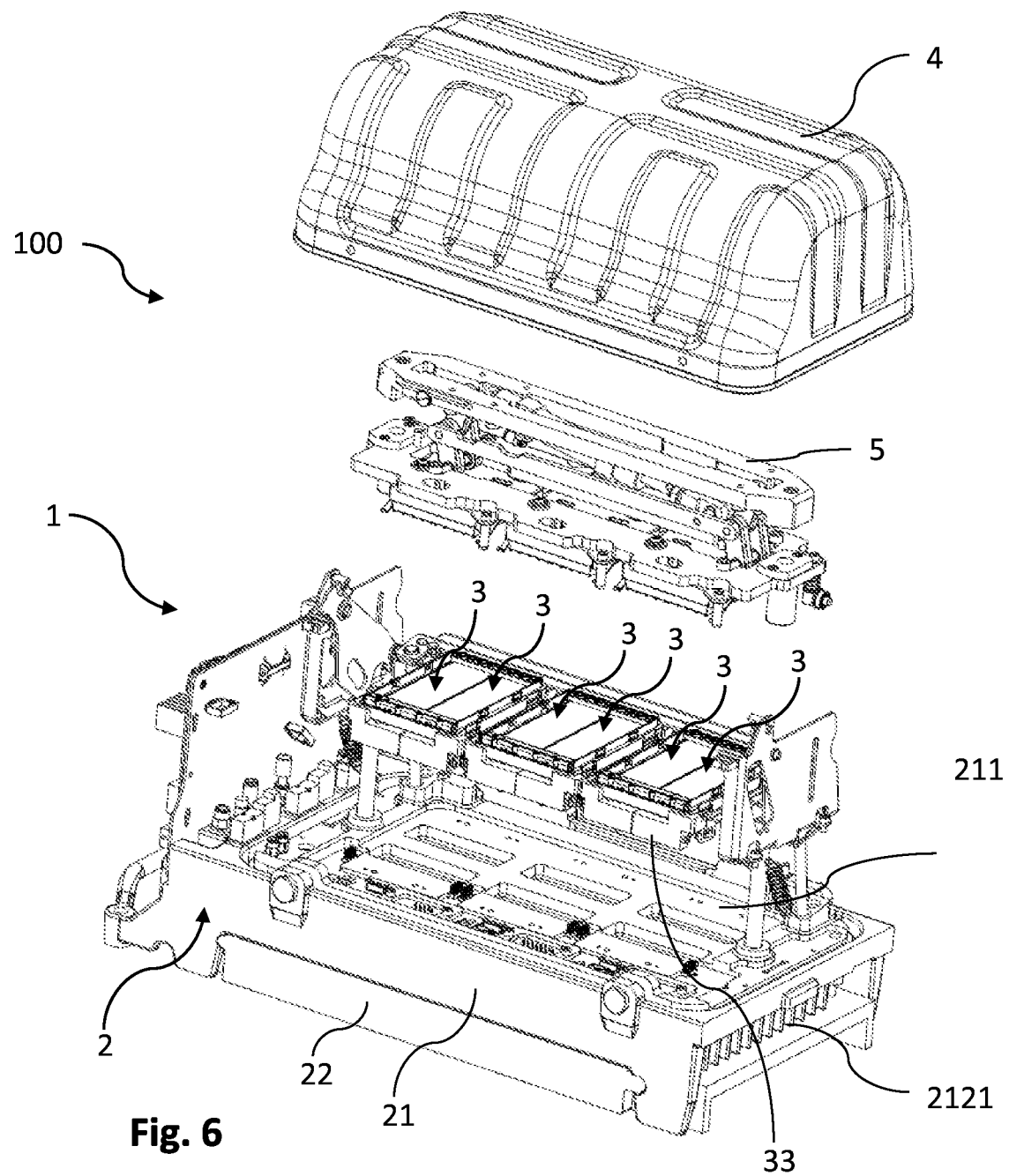
FIG. 6 is a conceptual exploded view of a device for simultaneous thermal cycling of a plurality of samples in a dPCR consumable according to an embodiment of the present disclosure.

FIG. 6 shows a conceptual exploded view of a device 100 for simultaneous thermal cycling of a plurality of samples in a dPCR consumable, according to an embodiment of the present disclosure. The lowest component in the illustration in FIG. 6 is a thermal unit 1 as already described above in part. The thermal unit 1 comprises a cooling structure 2 as described above and which corresponds to the embodiment as illustrated in FIGS. 1 to 4. The cooling structure 2 is shown from above so that the first side 211 of the heat sink 21 directed to the thermal blocks 3 is visible. In the embodiment as illustrated in FIG. 6, the thermal unit 1 comprises six thermal blocks 3 which are illustrated above the cooling structure 2. The thermal blocks 3 are to be assembled to the cooling structure 2 with their heat transfer plates 33 connected to the first side 211 of the heat sink 21. Two thermal blocks 3 are each arranged next to each other so that the six thermal blocks 3 form three groups of two thermal blocks 3, respectively. Above the group of thermal blocks 3, i.e. above the thermal unit 1, a downholder 5 is illustrated. The downholder 5 is to be assembled on top of the thermal unit 1 and is provided in order to press consumables containing samples for thermocycling to the top plates 32 of the thermal blocks 3. By pressing the consumables to the top plates 32, the heat transfer between the thermal blocks 3 and the samples is further improved. The downholder 5 can also comprise a function to open and close a door or a window of the housing 4 to load and unload consumables to and from the thermal blocks 3. Illustrated on a top side of the illustration in FIG. 6, and to be assembled on top of the other components is the housing 4. The housing 4 covers the other components, and in particular the thermal blocks 3 loaded with samples during thermal cycling. The housing 4 can be made of stainless steel sheet metal or of plastic material. The housing 4 is permanently fixed to the heat sink 21 of the thermal unit 1.

While the current disclosure has been described in relation to its specific embodiments, it is to be understood that this description is for illustrative purposes only. Accordingly, it is intended that the disclosure be limited only by the scope of the claims appended hereto. In addition, various publications are cited herein, the disclosures of which are incorporated by reference in their entireties.

LIST OF REFERENCE NUMERALS 1 thermal unit
2 cooling structure
21 heat sink
211 first side of the heat sink
212 second side of the heat sink
2121 cooling fin structure
2122 snap interface
2123 connection interface
22 guide plate
221 air fan
223 tappet
224 gap
23 duct cover plate
231 through hole in the duct cover plate
24a first part of exhaust air duct
24b second part of exhaust air duct
242 arrow
25 intake air duct
251 separating wall
A-F arrows
3 thermal block
31 thermoelectric energy converter
32 top plate
321 topside 33 heat transfer plate
34 electronics board
4 housing
5 downholder
100 device for simultaneous thermal cycling

The invention claimed is:

1. A thermal unit for simultaneous thermal cycling of a plurality of samples, comprising at least one thermal block and a cooling structure, the thermal block comprising at least one thermoelectric energy converter and a heat transfer plate attached to the thermoelectric energy converter for dissipation of thermal energy away from the thermoelectric energy converter, and the cooling structure comprising a heat sink, a guide plate connected to the heat sink, and a duct cover plate connected to the guide plate, at least one air fan mounted to the guide plate, and an exhaust air duct formed from a channel between the guide plate and the duct cover plate, wherein
the heat sink is connected to the heat transfer plate on a first side of the heat sink and is exposed to the air fan on a second side of the heat sink, opposite the first side, with the air fan providing a stream of intake air towards the second side of the heat sink, and
the exhaust air duct guides a stream of exhaust air away from the second side of the heat sink, with the stream of intake air and the stream of exhaust air being structurally separated from each other.

2. The thermal unit according to claim 1, wherein the channel forming the exhaust air duct is configured to guide the stream of exhaust air substantially orthogonal to the stream of intake air.

3. The thermal unit according to claim 1, wherein the heat sink comprises a plurality of cooling fins disposed on its second side.

4. The thermal unit according to claim 3, wherein at least a portion of the plurality of cooling fins of the heat sink is arranged such that when viewed from a plan view on the second side of the heat sink the portion has the shape of a star.

5. The thermal unit according to claim 1, wherein the at least one air fan is arranged within a through hole in the guide plate of the cooling structure.

6. The thermal unit according to claim 1, further comprising an air intake duct for directing ambient air towards the air fan, wherein the air intake duct is structurally separated from the exhaust air duct.

7. The thermal unit according to claim 1, wherein the at least one thermal block further comprises at least one top plate with a substantially planar top side for thermal contact with a dPCR consumable, wherein the at least one thermoelectric energy converter is attached to a bottom side of the top plate opposite to its top side, and the heat transfer plate is connected to the at least one thermoelectric energy converter at a side opposite to its connection to the top plate.

8. The thermal unit according to claim 7, further comprising a housing in which the thermal block and the cooling unit are disposed, wherein the thermal block-further comprises at least one heat transfer medium disposed in the housing between the top plate and the thermoelectric energy converter and/or between the thermoelectric energy converter and the heat transfer plate.

9. The thermal unit according to claim 7, wherein the thermal block further comprises at least one temperature sensor in or at the top plate for temperature control.

10. The thermal unit according to claim 9, wherein the thermal block further comprises an electronics board electrically coupled to the temperature sensor and the thermoelectric energy converter and configured to receive a signal from the temperature sensor and control the thermoelectric energy converter based on the received signal.

11. The thermal unit according to claim 1, further comprising a housing in which the thermal block and the cooling unit are disposed, wherein the thermal block is removably coupled to the housing.

12. A device for simultaneous thermal cycling of a plurality of samples in a dPCR consumable, including
 a housing, and
 at least one thermal unit according to claim 1, secured within the housing.

13. The thermal unit of claim 2, wherein the channel forming the exhaust air duct is configured to guide at least a part of the stream of exhaust air around the at least one air fan.

14. The thermal unit of claim 3, wherein the plurality of cooling fins are protruding from the second side of the heat sink and arranged to be substantially parallel to the stream of intake air provided by the air fan.

15. The thermal unit of claim 14 wherein the cooling fins are provided in the form of a swaged fin structure comprising lifting bevels.

16. The thermal unit of claim 1, wherein the heat sink and the guide plate are connected by a snap-fit connection.

17. The thermal unit of claim 11, wherein the housing is configured to house a plurality of removably coupled thermal blocks.

* * * * *